(12) United States Patent
Di

(10) Patent No.: US 9,797,962 B2
(45) Date of Patent: Oct. 24, 2017

(54) SENSOR ELEMENT BASED ON MAGNETO-THERMOELECTRIC EFFECT, AND REALIZING METHOD THEREOF

(71) Applicant: SOOCHOW UNIVERSITY, Jiangsu (CN)

(72) Inventor: Guoqing Di, Jiangsu (CN)

(73) Assignee: SOOCHOW UNIVERSITY, Jiangsu (CN)

( * ) Notice: Subject to any disclaimer, the term of this patent is extended or adjusted under 35 U.S.C. 154(b) by 283 days.

(21) Appl. No.: 14/438,003

(22) PCT Filed: Dec. 10, 2012

(86) PCT No.: PCT/CN2012/086286
§ 371 (c)(1),
(2) Date: Apr. 23, 2015

(87) PCT Pub. No.: WO2014/063412
PCT Pub. Date: May 1, 2014

(65) Prior Publication Data
US 2015/0293186 A1   Oct. 15, 2015

(30) Foreign Application Priority Data
Oct. 26, 2012   (CN) .......................... 2012 1 0419190

(51) Int. Cl.
*G01R 33/02* (2006.01)
*G01R 33/00* (2006.01)
(Continued)

(52) U.S. Cl.
CPC ........... *G01R 33/02* (2013.01); *G01R 33/007* (2013.01); *G01R 33/06* (2013.01); *G11B 5/02* (2013.01)

(58) Field of Classification Search
CPC ...... G01R 33/02; G01R 33/007; G01R 33/06; G11B 5/02
See application file for complete search history.

(56) References Cited

U.S. PATENT DOCUMENTS 3,564,401 A * 2/1971 Coon ..................... G01R 33/02
324/203

FOREIGN PATENT DOCUMENTS

| CN | 201233438 Y | 5/2009 |
|---|---|---|
| CN | 102983791 A | 3/2013 |

(Continued)

OTHER PUBLICATIONS

Mitdank et al., Enhanced magneto-thermoelectric power factor of a 70nm Ni-nanowire, J. Appl. Phys. 111, 104320, 2012.*
(Continued)

*Primary Examiner* — Daniel Miller
(74) *Attorney, Agent, or Firm* — Pearne & Gordon LLP

(57) ABSTRACT

A sensor element based on a magneto-thermoelectric effect and realizing method thereof are provided, the sensor element includes a plurality of thermoelectric elements having an angular structure and are located in a magnetic field; the thermoelectric element is made of magnetic material having a thermoelectric effect, and includes a first side, a second side, and an angular part formed by connecting the two sides; the angular part is provided with a heating device; and the temperature in the region where the other end of the first side and the second side are located are less than or equal to the ambient temperature.

10 Claims, 2 Drawing Sheets

(51) Int. Cl.
  *G01R 33/06*  (2006.01)
  *G11B 5/02*   (2006.01)

(56)  References Cited

FOREIGN PATENT DOCUMENTS

| | | |
|---|---|---|
| EP | 1688923 A2 | 8/2006 |
| EP | 2267811 A2 | 12/2010 |
| JP | 2009202412 A | 9/2009 |
| JP | 2009280406 A | 12/2009 |
| WO | 02078021 A1 | 10/2002 |
| WO | 2008142748 A1 | 11/2008 |
| WO | 2010050125 A1 | 5/2010 |
| WO | 2011007767 A1 | 1/2011 |
| WO | 2011103437 A1 | 8/2011 |
| WO | 2012093587 A1 | 7/2012 |

OTHER PUBLICATIONS

Bowley et al., Magnetothermal Resistance and Magnetothermoelectric Effects in Bismuth Telluride, Proc, Phys. Soc. LXXII, 3, 1958.*

International Search Report for PCT/CN2012/086286 Aug. 1, 2013.

Jia-Luo, Chen et al. "Influence of magnetic anisotropy thermoelectric effect on spin-dependent devices" IN: Acta Phys. Sin. vol. 61, No. 20 (2012) pp. 207201-5, China.

\* cited by examiner

SENSOR ELEMENT BASED ON MAGNETO-THERMOELECTRIC EFFECT, AND REALIZING METHOD THEREOF

The present application is a national phase of international application No. PCT/CN2012/086286, which claims the priority to Chinese Patent Application No. 201210419190.1, entitled "SENSOR ELEMENT BASED ON MAGNETO-THERMOELECTRIC EFFECT, AND REALIZING METHOD THEREOF", filed on Oct. 26, 2012 with the Chinese State Intellectual Property Office, which are incorporated herein by reference in their entirety.

FIELD

The disclosure relates to the technical field of sensors, and particularly, relates to a sensor element based on magneto-thermoelectric effect and an implementation method thereof.

BACKGROUND

Magnetic sensors are widely used in many technical fields such as spatial location and orientation, automatic monitoring and control, and information storage. A magnetic sensing element in the magnetic sensor is a key part which determines performance and application of the magnetic sensor.

In principle, the magnetic sensing elements may be classified into different types such as a type of Faraday magnetic induction, a type of anisotropy magneto-resistance (AMR) effect, a type of Hall effect, a type of giant magneto-resistance (GMR) effect and a type of tunnel giant magneto-resistance (TMR) effect. The sensors based on GRM effect and the sensors based on TMR effect, due to their high sensitivity, are applicable to super-capacity information storage, and thus draw attention of those skilled in related fields all over the world. In recent years, to satisfy increasing requirement on storage density, development of magneto-resistance elements with ultrahigh sensitivity is in intense competition. The research and development focus on improving sensitivity and operation stability of the elements by finding more appropriate material, more appropriate multi-layer structure and more appropriate manufacturing process.

For conventional technologies, in WO/2012/093587 (CO2FE-BASED HEUSLER ALLOY AND SPINTRONIC DEVICE USING SAME), it is proposed that a CPP-GMR element with a maximum MR ratio and a high output signal is acquired by using Heusler alloy; in WO/2011/103437 (A HIGH GMR STRUCTURE WITH LOW DRIVE FIELDS), a multi-period structural element having ferromagnetic exchange coupling and exhibiting giant magneto resistance (GMR) is proposed; in WO/2011/007767 (METHOD FOR PRODUCING MAGNETORESISTIVE EFFECT ELEMENT, MAGNETIC SENSOR, ROTATION-ANGLE DETECTION DEVICE), a method for regulating magnetization orientation of a fixed ferromagnetic film and simplifying a preparation process of a GMR film is disclosed; in Application Number JP2009280406 (METHOD OF MANUFACTURING TMR READ HEAD, AND TMR LAMINATED BODY), a method for acquiring a TMR read head with a high MR ratio is disclosed; in Application Number JP2009202412 (TUNNEL JUNCTION TYPE MAGNETORESISTIVE HEAD AND METHOD OF MANUFACTURING THE SAME), it is disclosed a method for acquiring a TMR magnetic head with reduced deterioration in the MR ratio in a region in which area resistance RA is smaller than $1.0\ \Omega\mu m^2$; in WO/2008/142748 (MAGNETIC HEAD FOR MAGNETIC DISK APPARATUS), it is disclosed a read head including a TMR element or CPP-GMR element and having good signal transmission performance, which is applied to a hard disk drive (HDD) device; in WO/2010/050125 (CPP-GMR ELEMENT, TMR ELEMENT, AND MAGNETIC RECORDING/REPRODUCTION DEVICE), an $L_{10}Mn_{50}Ir_{50}$ film having crystal magnetic anisotropy energy of $2\times10^8\ erg/cm^3$ is employed as an antiferromagnetic layer, which assures stability of the element for an astronomical number of $1.2\times10^{49}$ years even if the element size is 5 nm.

Though the sensors based on GMR or TMR effect can satisfy recent development requirement on storage density technology at present, the sensor elements of the two types both have a multi-layer structure formed by superposing films having different performances (for example, see patents WO/2010/050125; WO/2002/078021; Application Number EP2006000077; Application Number EP2010011433), which has a special requirement on performance of film material, and causes a complicated preparation process for the element. In addition, the size of the magnetic head is required to be further reduced. Comprehensively limited to these key factors, difficulty in improving the performance of the element is increasing.

Hence, to address the above technical problems, research and development for the magnetic sensor element based on a new physical effect become a new direction of technical development in the field.

SUMMARY

In view of this, the disclosure is to provide a sensor element based on magneto-thermoelectric effect and an implementation method thereof.

To achieve the above purpose, technical solutions according to embodiments of the disclosure are as follows.

A sensor element based on magneto-thermoelectric effect is provided. The sensor element includes a plurality of thermoelectric elements, each of which has an angular structure, in a magnetic field, the thermoelectric element is made of magnetic material having thermoelectric effect, and the thermoelectric element includes a first side, a second side and an angular part formed by connecting the first side and the second side, the angular part is provided with a heating device, and temperatures of regions where the other ends of the first side and the second side locate are less than or equal to ambient temperature.

As further improvement of the disclosure, the heating device is an electric heating filament or an illumination device, the angular part is heated by electrifying the electric heating filament or by local illumination, and heating temperature is adjusted by current or light intensity.

As further improvement of the disclosure, a thin insulating layer is further disposed between the electric heating filament and the thermoelectric element.

As further improvement of the disclosure, the first side and the second side of the thermoelectric element are formed by bending a same magnetic material having magneto-thermoelectric effect, or formed by welding different magnetic materials having magneto-thermoelectric effect, an angle between the first side and the second side is in a range from 0 to 180 degrees, and the angular part is a bended part between the first side and the second side or a welded part between the first side and the second side.

As further improvement of the disclosure, the first side and the second side of the thermoelectric element are made of an usual filament of magnetic material, or are made by depositing a thin-film filament on an insulating substrate through vacuum coating and micromachining.

As further improvement of the disclosure, the plurality of thermoelectric elements, each of which has an angular structure, in the magnetic field are connected in series, or connected in parallel, or connected in a combination of series and parallel; the plurality of thermoelectric elements are connected in sequence to form a coil-like shape with an end of the second side of one thermoelectric element being electrically connected using an additional filament to an end of the first side of a next thermoelectric element in a case that the plurality of thermoelectric elements are connected in series; and ends of the first sides of the thermoelectric elements are electrically connected to each other and ends of the second sides of the thermoelectric elements are electrically connected to each other in a case that the plurality of thermoelectric elements are connected in parallel.

As further improvement of the disclosure, an angle between the first side and the second side of one thermoelectric element is 90 degrees; and a section of a coil formed by the plurality of thermoelectric elements sequentially connected in series is right-triangle shaped.

As further improvement of the disclosure, the magnetic material of the thermoelectric element having thermoelectric effect is metal, semimetal, semiconductor, or conducting oxide.

As further improvement of the disclosure, a plane where the thermoelectric element locates is parallel to the magnetic field.

Corresponding, an implementation method of a sensor element based on magneto-thermoelectric effect is provided. The method includes:

placing a sensor element in a magnetic field, where the sensor element includes a plurality of thermoelectric elements each of which has an angular structure, the thermoelectric element is made of magnetic material having thermoelectric effect, and the thermoelectric element comprises a first side, a second side and an angular part formed by connecting the first side and the second side;

heating the angular part of the thermoelectric element, to make a temperature of the angular part higher than temperatures of the other ends of the first side and the second side; and converting, by the thermoelectric element having the angular structure, change of the magnetic field into an electric signal based on magneto-thermoelectric effect in a case that the magnetic field changes, and outputting the electric signal in a form of voltage from two ends of the thermoelectric element.

Compared with the conventional technologies, the sensor element according to the disclosure has a simple structure, a simple manufacturing process and a stable performance, can be processed into various forms and sizes, and can be used to develop different types of magnetic field sensors, particularly can be used to develop a new generation of magnetic read head for storing ultra-high density magnetic information, and thus is widely applied in various fields such as information storage.

BRIEF DESCRIPTION OF THE DRAWINGS

To describe the technical solutions for the embodiment of the present disclosure or technical solutions in conventional technology more clearly, the following briefly describes the drawings involved in the embodiments of the present disclosure or in the conventional technology. Apparently, the drawings described below are merely some embodiments of the invention, and persons of ordinary skill in the art can derive other drawings according to these drawings without any creative effort.

DETAILED DESCRIPTION

A sensor element based on magneto-thermoelectric effect is disclosed according to the disclosure. The sensor element includes a plurality of thermoelectric elements, each of which has an angular structure, in a magnetic field, the thermoelectric element is made of magnetic material having thermoelectric effect, and the thermoelectric element includes a first side, a second side and an angular part formed by connecting the first side and the second side, the angular part is provided with a heating device, and temperatures of regions where the other ends of the first side and the second side locate are less than or equal to ambient temperature.

An implementation method of a sensor element based on magneto-thermoelectric effect is further disclosed according to the disclosure. The method includes:

placing a sensor element in a magnetic field, where the sensor element includes a plurality of thermoelectric elements each of which has an angular structure, the thermoelectric element is made of magnetic material having thermoelectric effect, and the thermoelectric element comprises a first side, a second side and an angular part formed by connecting the first side and the second side;

heating the angular part of the thermoelectric element, to make a temperature of the angular part higher than temperatures of the other ends of the first side and the second side; and converting, by the thermoelectric element having the angular structure, change of the magnetic field into an electric signal based on magneto-thermoelectric effect in a case that the magnetic field changes, and outputting the electric signal in a form of voltage from two ends of the thermoelectric element.

With the sensor element based on the magneto-thermoelectric effect and the implementation method thereof according to the disclosure, the thermoelectric element with the angular structure is placed in a magnetic field, an angular part of the thermoelectric element is heated, and the voltage between two ends of the thermoelectric element is changed as the magnetic field changes, thereby achieving conversion from magnetic (field) information to electric information.

To make the persons skilled in the art better understand the technical solutions of the disclosure, the technical solutions of the embodiments of the disclosure are described clearly and completely below in conjunction with the drawings involved in the embodiments of the disclosure. Apparently, the described embodiments are merely some rather than all of the embodiments of the invention. All other embodiments obtained by persons skilled in the art based on these embodiments of the disclosure without any creative efforts shall fall within the protection scope of the disclosure.

Figure 1:
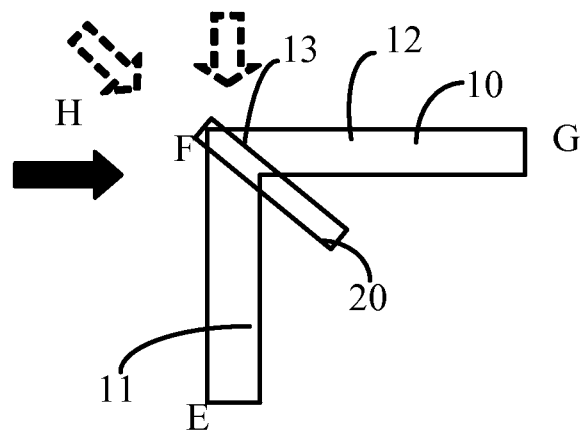
FIG. 1 is a schematic structural diagram of a thermoelectric element in a sensor element according to an embodiment of the disclosure.
Figure 2:
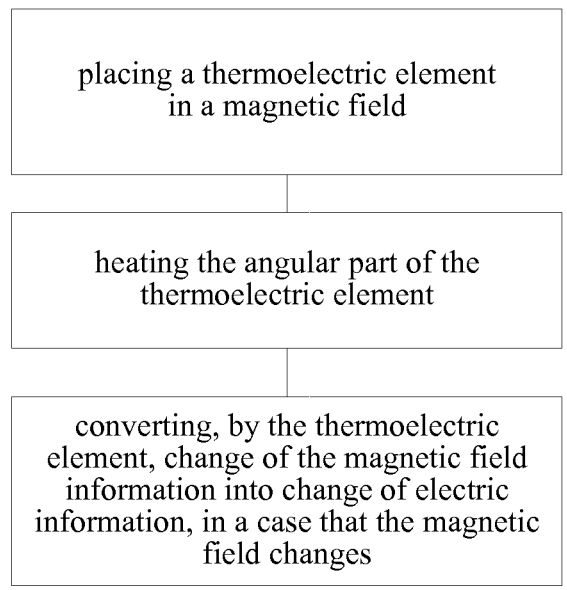
FIG. 2 is a schematic flow chart of an implementation principle of a sensor element according to an embodiment of the disclosure.

Reference is made to FIG. 1. A sensor element based on magneto-thermoelectric effect according to an embodiment of the disclosure includes a plurality of thermoelectric elements 10, each of which has an angular structure, in a magnetic field H. The thermoelectric element 10 is made of magnetic material having thermoelectric effect. The thermoelectric element 10 includes a first side 11, a second side 12 and an angular part 13 formed by connecting the first side 11 and the second side 12. The angular part 13 is provided with a heating device. The heating device is an electric heating filament or an illumination device. The angular part 13 is heated by electrifying the electric heating filament or by local illumination. The heating temperature is adjusted by current or light intensity. Preferably, the electric heating filament 20 is electrified to heat the angular part 13 in the embodiment, and the heating temperature is adjusted by amplitude of current.

An implementation method of a sensor element according to the embodiment includes:

placing the thermoelectric element 10 in the magnetic field H;

heating the angular part 13 of the thermoelectric element 10, to make the temperature of the angular part 13 higher than the temperatures of the other ends of the first side 11 and the second side 12; and converting, by the thermoelectric element 10, change of the magnetic field into an electric signal based on the magneto-thermoelectric effect, in a case that the magnetic field H changes.

The thermoelectric element according to the embodiment is made of magnetic material having thermoelectric effect and has magnetic anisotropy of thermoelectric effect. The thermoelectric element may be metal, semimetal, semiconductor, or conducting oxide. The first side and the second side of the thermoelectric element are made of an usual filament of magnetic material, or are made by depositing a thin-film filament on an insulating substrate through vacuum coating and micromachining, to form a micro or small-sized sensor. The thermoelectric element is placed in a changeable magnetic field H. Preferably, the plane where the thermoelectric element locates is parallel to the direction of the changeable magnetic field H. Alternatively, there may be an angle between the plane where the thermoelectric element locates and the direction of the changeable magnetic field H in other embodiment.

The angular part 13 (F part) is heated by the heating device to form a high-temperature region. Ends E and G of the first side 11 and the second side 12 are placed in low-temperature regions or directly placed under the ambient temperature. In this case, the ends E and G are two low-temperature nodes, and the angular part F is a high-temperature node. The thermoelectric element directly converts thermal energy at the high-temperature end into electric energy by temperature difference between the high-temperature node and the low-temperature nodes, so as to generate a voltage between the two ends E and G of the thermoelectric element. The amplitude of the voltage changes as the intensity of the magnetic field changes and the polarity of the voltage changes as the direction of the magnetic field changes, thereby achieving conversion between the magnetic (field) information and the electric information. Preferably, the electric heating filament 20 is directly contacted to the angular part (F part) of the thermoelectric element 10 in this embodiment. Alternatively, the electric heating filament may be indirectly contacted to the thermoelectric element by disposing a thin insulating layer between the electric heating filament and the thermoelectric element in other embodiment.

The first side and the second side of the thermoelectric element according to the disclosure may be made of a same material or made of different materials satisfying requirement on heat transfer matching. In a case that a same material is used, the first side and the second side are formed by directly bending the material, and the bended part is the angular part of the thermoelectric element. In a case that different materials are used, two materials of the first side and the second side are connected together by welding, and the welded part is the angular part of the thermoelectric element. The angle between the first side and the second side is in a range from 0-180 degrees. Preferably, in a preferred embodiment of the disclosure, the thermoelectric element is formed by bending a same magnetic material having thermoelectric effect, and the bended angle between the first side and the second side is optimally 90 degrees.

Figure 3:
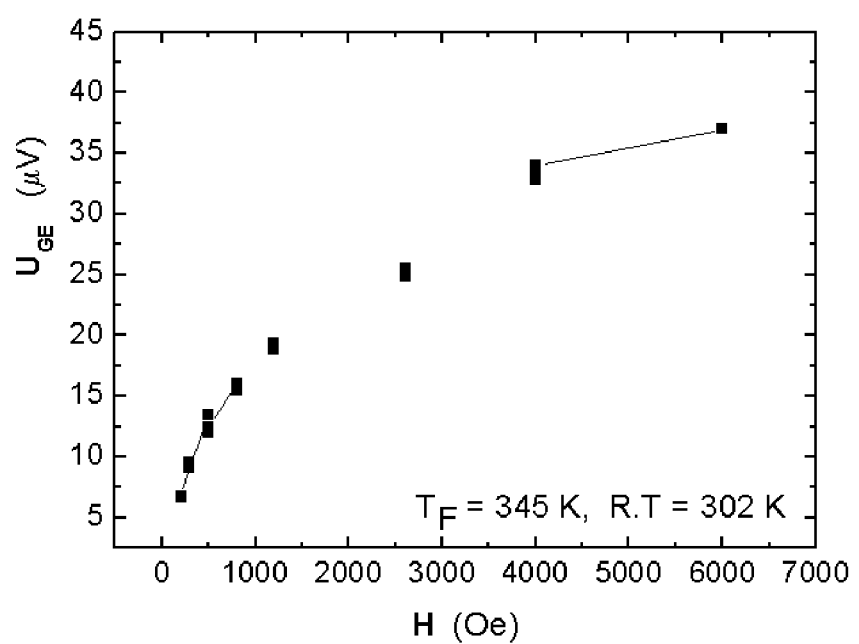
FIG. 3 is a diagram illustrating change of a voltage between two ends G and E of a thermoelectric element as intensity of a magnetic field changes.

Reference is made to FIG. 3 which illustrates a curve showing the change of the voltage $U_{GE}$ between two ends G and E of the thermoelectric element as the intensity of the magnetic filed H gradually increases from 0 to 6000 Oe, in a case that F part of the element is electrically heated to a temperature of 345K, the ambient temperature is 302 K and the direction of the magnetic field is parallel to the second side of the element, according to an embodiment of the disclosure.

According to the disclosure, the thermoelectric element may be independently used, and a single thermoelectric element generates very small electromotive force which equals to several microvolts to hundreds of microvolts. Alternatively, a plurality of thermoelectric elements may be connected in series to amplify the electric signal and improve sensitivity of the sensor. In a case that the thermoelectric elements are connected in series, the thermoelectric elements are connected in sequence to form a coil-like shape with an end of the second side of one thermoelectric element being electrically connected using an additional filament to an end of the first side of a next thermoelectric element. Preferably, an angle between the first side and the second side of the thermoelectric element is 90 degree, and the section of the coil formed by the thermoelectric elements sequentially connected in series is right-triangle shaped. The hypotenuse of the right triangle may be curved in other embodiment. In a case that the thermoelectric elements are connected in parallel, ends of the first sides of the thermoelectric elements are electrically connected to each other and ends of the second sides of the thermoelectric elements are electrically connected to each other, to be used as two connecting ends respectively. The voltage between two ends of a combination of the thermoelectric elements connected in series is in direct proportion to the number of the elements, thereby improving performance of magnetic-electric information conversion of the sensor element.

It can be seen from the above technical solutions that, with the sensor element based on magneto-thermoelectric effect and the implementation method thereof according to the disclosure, a thermoelectric element with an angular structure is placed in a magnetic field, an angular part of the thermoelectric element is heated, and the voltage between two ends of the thermoelectric element is changed as the magnetic field changes, thereby achieving conversion from magnetic (field) information to electric information.

The sensor element according to the disclosure has a simple structure and a stable performance, can be processed into various forms and sizes, and can be used to develop different types of magnetic (field) sensors, particularly can be used to develop a new generation of magnetic read head for storing ultra-high density magnetic information, and thus is widely applied in various fields such as information storage.

Those of ordinary skills in the art can appreciate that the disclosure is not limited to the details of above exemplary embodiments and can be realized with other specific manners without departing from the spirit and basic features of the invention. Hence, the embodiments should be considered in any case as exemplary rather than limiting, and the scope of the disclosure is defined by the claims but not the above description. Therefore, the invention is meant to include all changes within the meaning and scope of equivalent elements of the claims. The reference numerals in the claims should not be considered as limitation to the claims.

In addition, it should be understood that although the specification is described with reference to several embodiments, it is not meant that one embodiment includes one independent technical solution. The description manner of the specification is merely for purpose of clarity. Those of ordinary skills in the art should take the specification as a whole, and technical solutions in the embodiments may be properly combined to form other embodiments understandable by those skilled in the art.

The invention claimed is:

1. A sensor element based on magneto-thermoelectric effect, wherein the sensor element comprises a plurality of thermoelectric elements, each of which has an angular structure, in a magnetic field, the thermoelectric element is made of magnetic material having thermoelectric effect, and the thermoelectric element comprises a first side, a second side and an angular part formed by connecting the first side and the second side, and has magnetic anisotropy of thermoelectric effect, the angular part is provided with a heating device, and wherein when the sensor element is put into use, temperatures of regions where the other ends of the first side and the second side locate are less than or equal to ambient temperature, and the angular part of the thermoelectric element is heated to make a temperature of the angular part higher than temperatures of the other ends of the first side and the second side.

2. The sensor element according to claim 1, wherein the heating device is an electric heating filament or an illumination device, the angular part is heated by electrifying the electric heating filament or by local illumination, and heating temperature is adjusted by current or light intensity.

3. The sensor element according to claim 2, wherein a thin insulating layer is further disposed between the electric heating filament and the thermoelectric element.

4. The sensor element according to claim 1, wherein the first side and the second side of the thermoelectric element are a same magnetic material having magneto-thermoelectric effect, or different magnetic materials having magneto-thermoelectric effect, an angle between the first side and the second side is in a range from 0 to 180 degrees, and the angular part is a bended part between the first side and the second side or a welded part between the first side and the second side.

5. The sensor element according to claim 4, wherein the first side and the second side of the thermoelectric element are made of a filament of magnetic material, or are made by depositing a thin-film filament on an insulating substrate through vacuum coating and micromachining.

6. The sensor element according to claim 4, wherein the plurality of thermoelectric elements, each of which has an angular structure, in the magnetic field are connected in series, or connected in parallel, or connected in a combination of series and parallel; the plurality of thermoelectric elements are connected in sequence to form a coil-like shape with an end of the second side of one thermoelectric element being electrically connected using an additional filament to an end of the first side of a next thermoelectric element in a case that the plurality of thermoelectric elements are connected in series; and ends of the first sides of the thermoelectric elements are electrically connected to each other and ends of the second sides of the thermoelectric elements are electrically connected to each other in a case that the plurality of thermoelectric elements are connected in parallel.

7. The sensor element according to claim 6, wherein an angle between the first side and the second side of one thermoelectric element is 90 degrees; and a section of a coil formed by the plurality of thermoelectric elements sequentially connected in series is right-triangle shaped.

8. The sensor element according to claim 1, wherein the magnetic material of the thermoelectric element having thermoelectric effect is metal, semimetal, semiconductor, or conducting oxide.

9. The sensor element according to claim 1, wherein a plane where the thermoelectric element locates is parallel to the magnetic field.

10. An implementation method of a sensor element based on magneto-thermoelectric effect, comprising:
    placing a sensor element in a magnetic field, wherein the sensor element comprises a plurality of thermoelectric elements each of which has an angular structure, the thermoelectric element is made of magnetic material having thermoelectric effect, and the thermoelectric element comprises a first side, a second side and an angular part formed by connecting the first side and the second side, and has magnetic anisotropy of thermoelectric effect;
    heating the angular part of the thermoelectric element, to make a temperature of the angular part higher than temperatures of the other ends of the first side and the second side; and
    converting, by the sensor element, change of the magnetic field into an electric signal based on magneto-thermoelectric effect in a case that the magnetic field changes, and outputting the electric signal in a form of voltage from two ends of the sensor element.

* * * * *